(12) United States Patent  
Larson et al.

(10) Patent No.: US 11,569,056 B2  
(45) Date of Patent: Jan. 31, 2023

(54) PARAMETER ESTIMATION FOR METROLOGY OF FEATURES IN AN IMAGE

(71) Applicant: FEI Company, Hillsboro, OR (US)

(72) Inventors: Brad Larson, Portland, OR (US); John Flanagan, Hillsboro, OR (US); Maurice Peemen, Rijsbergen (NL)

(73) Assignee: FEI Company, Hillsboro, OR (US)

( * ) Notice: Subject to any disclaimer, the term of this patent is extended or adjusted under 35 U.S.C. 154(b) by 513 days.

(21) Appl. No.: 16/667,506

(22) Filed: Oct. 29, 2019

(65) Prior Publication Data

US 2020/0161083 A1    May 21, 2020

Related U.S. Application Data

(60) Provisional application No. 62/768,717, filed on Nov. 16, 2018.

(51) Int. Cl.
| | |
|---|---|
| *H01J 37/22* | (2006.01) |
| *G06T 7/00* | (2017.01) |
| *H01J 37/28* | (2006.01) |
| *G01N 21/956* | (2006.01) |
| *H04N 19/149* | (2014.01) |

(52) U.S. Cl.  
CPC ...... *H01J 37/222* (2013.01); *G01N 21/95607* (2013.01); *G06T 7/001* (2013.01); *H01J 37/28* (2013.01); *H04N 19/149* (2014.11); *G01N 2021/95615* (2013.01)

(58) Field of Classification Search  
CPC .. H01J 37/222; H01J 37/28; G01N 21/95607; G01N 2021/95615; G01N 23/04; G06T 7/001; G06T 7/0004; H04N 19/149; G06K 9/6262; G06V 10/454  
USPC ......................................................... 382/156  
See application file for complete search history.

(56) References Cited

U.S. PATENT DOCUMENTS

2020/0090049 A1* 3/2020 Aliper ................. G06K 9/6262  
2020/0151514 A1* 5/2020 Liu ....................... G06N 3/0454

* cited by examiner

*Primary Examiner* — Ayodeji O Ayotunde

(57) ABSTRACT

Methods and apparatuses are disclosed herein for parameter estimation for metrology. An example method at least includes optimizing, using a parameter estimation network, a parameter set to fit a feature in an image based on one or more models of the feature, the parameter set defining the one or more models, and providing metrology data of the feature in the image based on the optimized parameter set.

18 Claims, 6 Drawing Sheets  
(2 of 6 Drawing Sheet(s) Filed in Color)

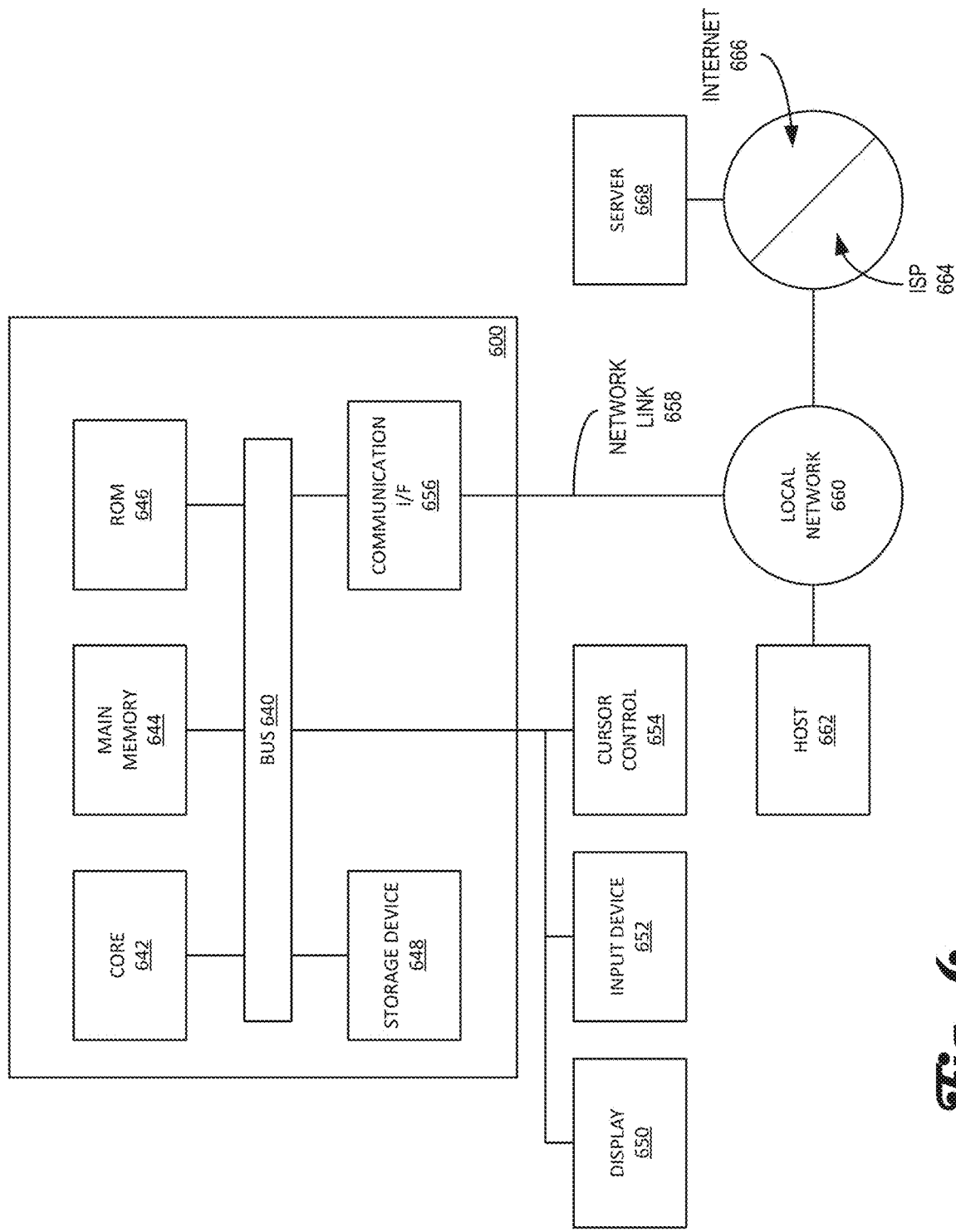

PARAMETER ESTIMATION FOR METROLOGY OF FEATURES IN AN IMAGE

CROSS REFERENCE TO RELATED APPLICATION

The present application claims the priority benefit of U.S. Patent Application Ser. No. 62/768,717, filed Nov. 16, 2018. The disclosures of the foregoing application are incorporated herein by reference

FIELD OF THE INVENTION

The invention relates generally to artificial intelligence (AI) enabled metrology, and specifically to AI enhanced metrology for use on charged particle microscopy images.

BACKGROUND OF THE INVENTION

In many areas of industry and research, analysis and measurement of small structures is performed for product/process development, quality control, medical evaluation, etc. Such analysis and measurement may be performed using various types of inspection tools, which likely include forming images of one or more structures of interest. For example, in the semiconductor industry, charged particle microscopes are used to image circuit structures on the nanometer scale, which typically become the basis for the analysis and measurement tasks. In such an example, measurements are performed on the images themselves to understand potential for defects and process control. Such analysis and measurements, however, requires a highly skilled operator to determine where to measure and key features for use in performing the measurements. This may typically be done using the creation of a recipe that can be ran once the key features are identified and located.

This identification and location of the key features by the skilled operator, however, can be tedious and void of robustness. Additionally, small changes in imaging conditions or manufacturing processes may require manually re-tuning the recipes due to the inability of the recipe to locate and/or identify the key features on its own. Such requirement to continually re-work the recipe due to changes in the imaging and/or the manufacturing makes full automation unreliable and/or unreachable. In many instances, the operators are required to screen out false positives to ensure the accuracy of the analysis. Removal of the constant human interaction with the process is desirable in all industries to increase productivity and reduce costs. Additionally, a desire for more robust automatic analysis and measurement of structures, especially small structures that experience changes in shape and consistency, is desired.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 6 is an example functional block diagram of a computing system in accordance with an embodiment of the present disclosure.

Like reference numerals refer to corresponding parts throughout the several views of the drawings.

DETAILED DESCRIPTION OF EMBODIMENTS

Figure 1:
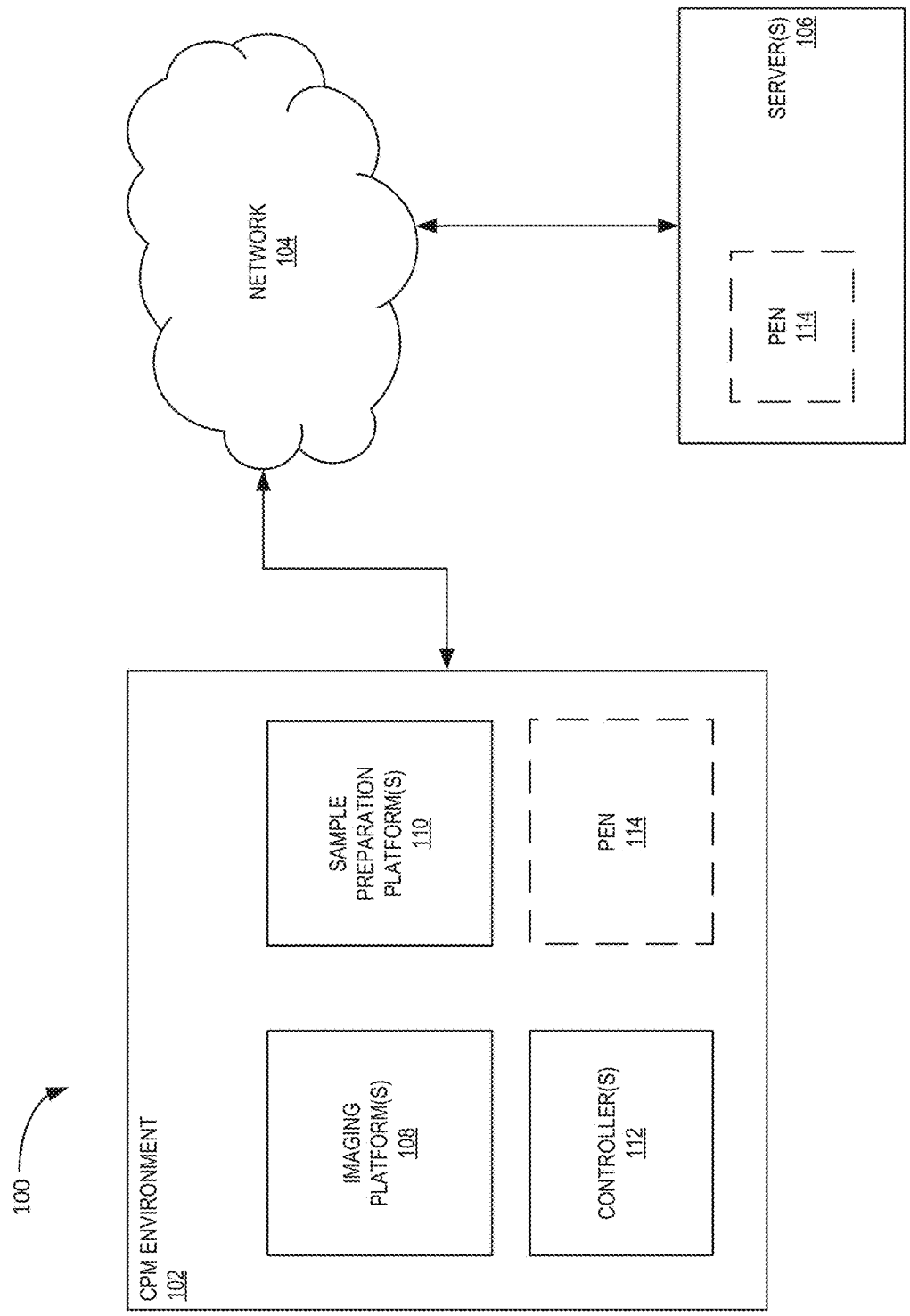
FIG. 1 is an example of a charged particle microscope system in accordance with an embodiment of the present disclosure.

Embodiments of the present invention relate to AI enhanced metrology. In some examples, the AI optimizes model parameters to fit the model to features of interest, then the desired metrology data is obtained from the optimized model parameters. In some examples, the optimization of the model parameters is recursively performed by a regression convolutional neural network that receives an image of a feature and model images of the feature generated based on initial parameters, which are then optimized through recursive application of the regression convolutional neural network. The optimized parameters then define a model feature nearly exactly matching the feature in the image, and which provides desired metrology data. However, it should be understood that the methods described herein are generally applicable to a wide range of different AI enhanced metrology, and should not be considered limiting.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items. Additionally, in the following discussion and in the claims, the terms "including" and "comprising" are used in an open-ended fashion, and thus should be interpreted to mean "including, but not limited to . . . ." The term "integrated circuit" refers to a set of electronic components and their interconnections (internal electrical circuit elements, collectively) that are patterned on the surface of a microchip. The term "semiconductor device" refers generically to an integrated circuit (IC), which may be integral to a semiconductor wafer, separated from a wafer, or packaged for use on a circuit board. The term "FIB" or "focused ion beam" is used herein to refer to any collimated ion beam, including a beam focused by ion optics and shaped ion beams.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In general, metrology on images, e.g., using images for a basis of measurement, obtained with a charged particle microscope, for example, has conventionally required heavy user interaction to obtain quality data. The heavy user interaction may be required because size, shape, noise, and contrast variations may otherwise result in failed or incorrect measurements. While metrology is a required aspect of process control and defect detection in certain industries, such as the microelectronics industry, improvements in image recognition and metrology are greatly desired irrespective of the industry. It should be noted that while the discussion herein uses the microelectronics industry and circuit/component structures to illustrate the disclosed techniques, the use of the microelectronics industry is not limiting and the disclosed techniques may be implemented on images of any kind for any measurement purposes without exceeding the bounds of the disclosure, and all current and future uses are contemplated herein.

One solution to the above disclosed problem includes a parameter estimation network (PEN) that aligns a feature model to the reference image through a recurrent convolutional neural network. The parameter estimation network differs from facial recognition in that a model is provided to fit a variety of different features. As such, the feature model is an input into PEN. This feature model is customized per feature and then trained on the PEN. Secondly, TEM metrology $1\sigma$ measurement precision less than 0.1% of the image resolution is desired to be comparable to current TEM metrology. To achieve this sizeable improvement, PEN includes improvements in model definition, training, and recursion compared with other methods. The parameter estimation network is designed to fit model parameters to a supplied image, which then also provides the desired metrology data.

FIG. 1 is an example of a charged particle microscope system 100 in accordance with an embodiment of the present disclosure. The charged particle microscope (CPM) system 100, or simply system 100, at least includes a CPM environment 102, a network 104, one or more servers 106, and a parameter estimation network (PEN) 114. The CPM system 100 may be used to investigate and analyze samples of various size and makeup. For one example, the CPM system 100 may be implemented, at least partially, at an integrated circuit manufacturing site and used to analyze and measure various aspects of wafers and circuits fabricated at the site. In some embodiments, the CPM system 100 may be distributed across various locations. For example, the CPM environment 102 may be located at a fabrication or development location, the network 104 distributed locally, regionally, or nationally, and the server 106 located at a server farm and coupled to the CPM environment 100 via the network 104. Regardless of the organization of the CPM system 100, the system 100 may at least be used to implement one or more PENs 114 to perform various metrology-related tasks.

The CPM environment 102 includes any type of charged particle microscope, but the application of the neural network and analytics disclosed herein is not limited to charged particle microscopy, which is used for illustrative purposes only. Example CPMs include scanning electron microscopes (SEMs), transmission electron microscopes (TEMs), scanning transmission electron microscopes (STEMs), focused ion beams (FIBs), and dual beam (DB) systems that include both electron and ion beam capabilities, to name a few. The CPM environment 102 may be used to obtain electron or ion images of samples, some of which may be thin sections, e.g., lamellae, taken from a larger sample or wafer. The CPM environment 102 may include various aspects that can be contained in a single tool or that may be situated in separate tools. For example, the CPM environment 102 may include an imaging platform 108, e.g., an SEM, TEM, or STEM, a sample preparation platform 110, and one or more controllers 112. Of course, each platform 108 and 110 may include more than one microscope/sample preparation tools as well.

The imaging platform 108 is used to obtain images of samples, some of the samples may have been prepared by the sample prep platform 110, but that is not necessary. The images are obtained using an electron and/or ion source to irradiate the sample with a respective beam of charged particles. In some examples, the charged particle beam imaging is obtained by a scanned beam, e.g., moved across the sample, while other examples the charged particle beam is not scanned. Backscattered, secondary, or transmitted electrons, for example, are then detected and gray scale images formed based thereon. The images include gray scale contrast depending on the materials of the sample, where the changes in gray scale indicate changes in the material type and/or crystal orientation. The imaging platform 108 may be controlled by internal controls (not shown), controller 112, or a combination thereof.

The sample prep platform 110 forms some of the samples that are imaged by the imaging platform 108. Of course, imaged samples may also be formed by other tools (not shown). The sample prep 110 may, for example, be a DB system that uses a FIB to prepare and assist in the removal of a thin sample from a larger sample, such as by ion milling, ion induced etching, or a combination thereof, and other processes to process the sample for imaging. Other processes may include, but are not limited to, planarizing mills/etches, fiducial generation, cross-section formation, top-down lamella preparation, etc. The sample prep platform 110 may also include an electron imaging component that allows the sample prep process to be monitored, but the electron imaging component is not required. In some embodiments, the sample prep platform 110 may include other physical preparation aspects—lasers, cutting tools, resin encapsulation tools, cryogenic tools, etc.—that are used to prepare the sample for the imaging platform 108. The sample prep platform 110 may be controlled by internal controls (not shown), controller 112, or a combination thereof.

The network 104 may be any kind of network for transmitting signals between the CPM environment 102 and the server(s) 106. For example, the network 104 may be a local area network, a large area network, or a distributive network, such as the internet, a telephony backbone, and combinations thereof.

The servers 106 may include one or more computing platforms, virtual and/or physical, that can run code for various algorithms, neural networks, and analytical suites. While not shown, a user of the CPM environment 102 may have access to the servers 106 for retrieval of data, updating software code, performing analytical tasks on data, etc., where the access is through the network 104 from the user's local computing environment (not shown). In some embodiments, the user accesses image data stored on the servers 106, implements segmentation and regression tasks using the PEN 114 (which may be executed on the servers 106 or the CPM Environment 102), and performs metrology at their local computing environment. In some embodiments, the segmentation and regression tasks may be performed in conjunction with model generating tasks performed by algorithms 116.

In operation, one or more images of a sample are obtained by the imaging platform 108. At least one of the images, which includes one or more structures of interest for example, may be analyzed by parameter estimation network (PEN) 114 to provide metrology data on the one or more structures of interest. The PEN 114 may be included with CPM environment 102, servers 106, or a combination thereof. The metrology data is determined by PEN 114 based on the recursive application of a regression convolutional neural network to an image of a feature of interest and one or more models of the feature of interest. The one or more models may be initially generated by based on an initial parameter set, which is step-wise optimized by comparing the one or more models to the feature in the image, then adjusting the parameter set so that the model converges to the feature of interest. Once the parameter set is optimized, then the metrology data is provided based on the model, not the image. Convergence of the model/parameter set may be determined based on a pixel step size between iterations falling below a pixel step threshold, such as 0.5 pixels, or based on a threshold number of iterations performed, 12 for example. The thresholds, however, are a non-limiting aspect of the present disclosure and any user may define their desired thresholds.

Figure 3:
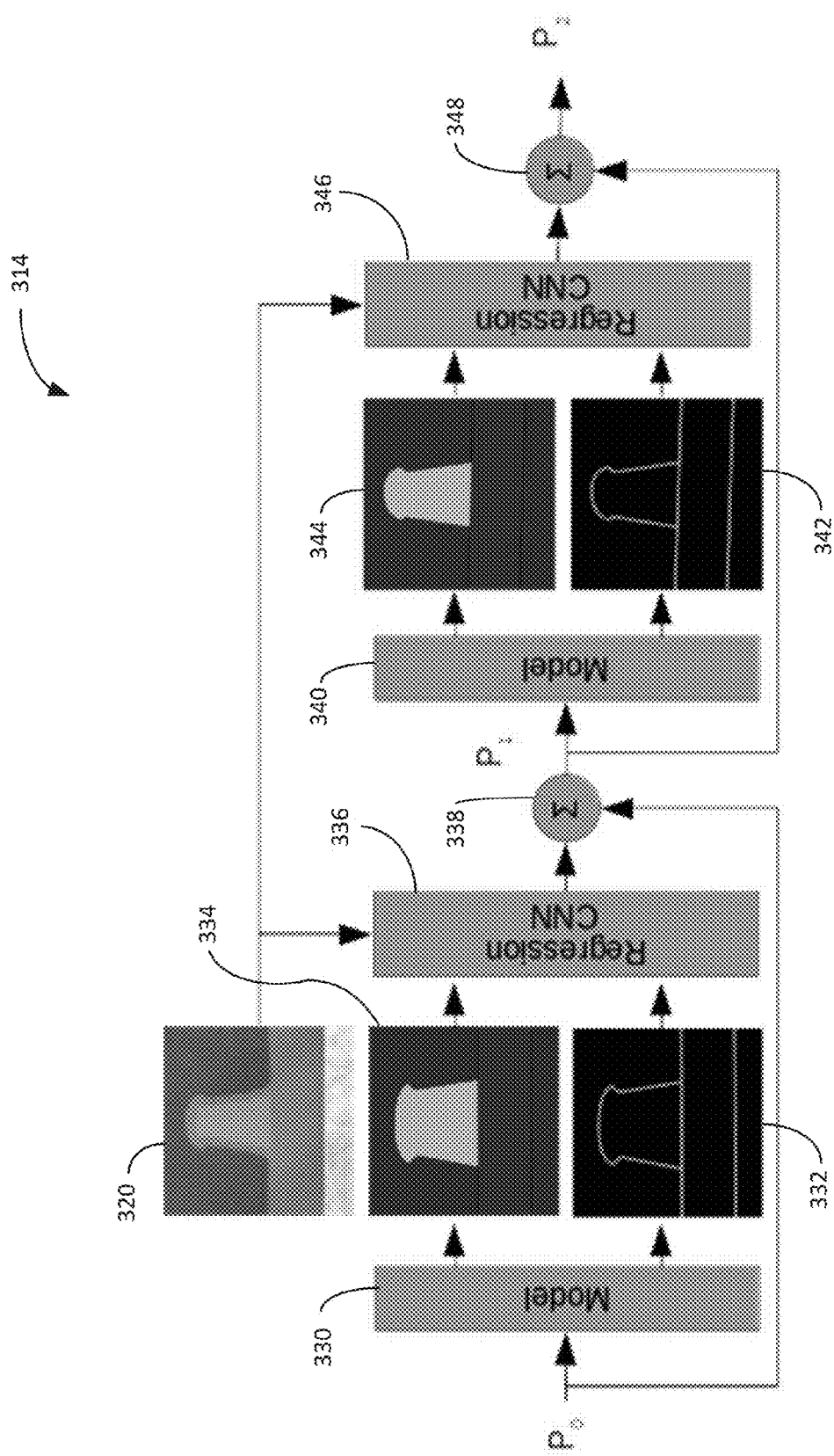
FIG. 3 is an example flow diagram of a parameter estimation network (PEN) in accordance with an embodiment disclosed herein.

More specifically, and as shown in FIG. 3, an initial parameter set $P_0$ is provided to a model generation function of the PEN 114, which may generate a region model image and a boundary model image, which are then provided to a regression convolutional neural network (RCNN) along with an image of one or more features. The RCNN may segment the image and extract a feature of interest. In some embodiments, reorientation of the feature and resizing the image to match the size of the model images may also occur. Once the feature of interest is extracted, the RCNN compares the segmented image of the feature of interest to the region and boundary model images, which may be done at the pixel level, but is not required. The differences between the image and the model images are then output and combined (e.g., added, subtracted, multiplied, divided) with the initial parameters to generate updated parameter set. Subsequently, based on the updated parameter set, the process may be repeated to further update (e.g., optimize) the parameter set, e.g., $P_1$. After each iteration of the process, the pixel step size, e.g., change in pixels of the model images, is compared against a threshold as noted above. Additionally, the number of iterations are compared to a threshold. If either of the comparisons have met or exceeded their respective threshold, the iterations are stopped and metrology data based on the optimized parameter set are provided.

While the image provided to the PEN 114 is described as being obtained by imaging platform 108, in other embodiments, the image may be provided by a different imaging platform and provided to the PEN 114 via the network 104.

In one or more embodiments, the RCNN of the PEN 114 may be referred to as a deep learning system or a machine-learning computing system. The RCNN of PEN 114 includes a collection of connected units or nodes, which are called artificial neurons. Each connection transmits a signal from one artificial neuron to another. Artificial neurons may be aggregated into layers. Different layers may perform different kinds of transformations on their inputs.

An RCNN is conventionally designed to process data that come in the form of multiple arrays, such as a color image composed of three two-dimensional arrays containing pixel intensities in three color channels. Example architecture of an RCNN is structured as a series of stages. The first few stages may be composed of two types of layers: convolutional layers and pooling layers. A convolutional layer applies a convolution operation to the input, passing the result to the next layer. The convolution emulates the response of an individual neuron to visual stimuli. A pooling layer combines the outputs of neuron clusters at one layer into a single neuron in the next layer. For example, max pooling uses the maximum value from each of a cluster of neurons at the prior layer. Following the convolutional layers and pooling layers will be one or more fully connected regression layers.

In one or more embodiments, the RCNN is configured to detect and/or identify, e.g., classify, objects of interest shown in an input image of a sample and compare multiple images to determine differences therebetween. An object of interest is a portion of the sample that is under study. The remaining portions of the specimen provide context for the object of interest. However, the object of interest needs to be measured while the remaining portions of the specimen may be ignored. As an example, one or more round, oval, pillar-like and/or layered structures may be objects of interest within an image, and the one or more components may be measured or measurements determined from an optimized model. Of course, the objects of interest disclosed herein are for illustrative purposes only, and any type of object of interest captured by a CPM system 100 may be measured by the PEN 114.

Prior to use, the PEN 114 may need to be trained to identify desired features of a structure in an image. Stated another way, the PEN 114 needs to learn how to segment images as desired and compare the segmented images to the model images. The training may typically include providing the PEN 114, or more precisely the RCNN, a number of annotated images with the annotations highlighting desired/different components of the structure. For example, boundaries and key reference points may be highlighted. The training images may typically include images of various quality and also include structures of various conformity with a desired shape. Based on the training images, PEN 114 learns how to identify the various classes of any image received regardless of image/structure quality. Further, the amount of training images may be based on the complexity of the structures being analyzed, with less complexity requiring fewer training images.

Figure 2:
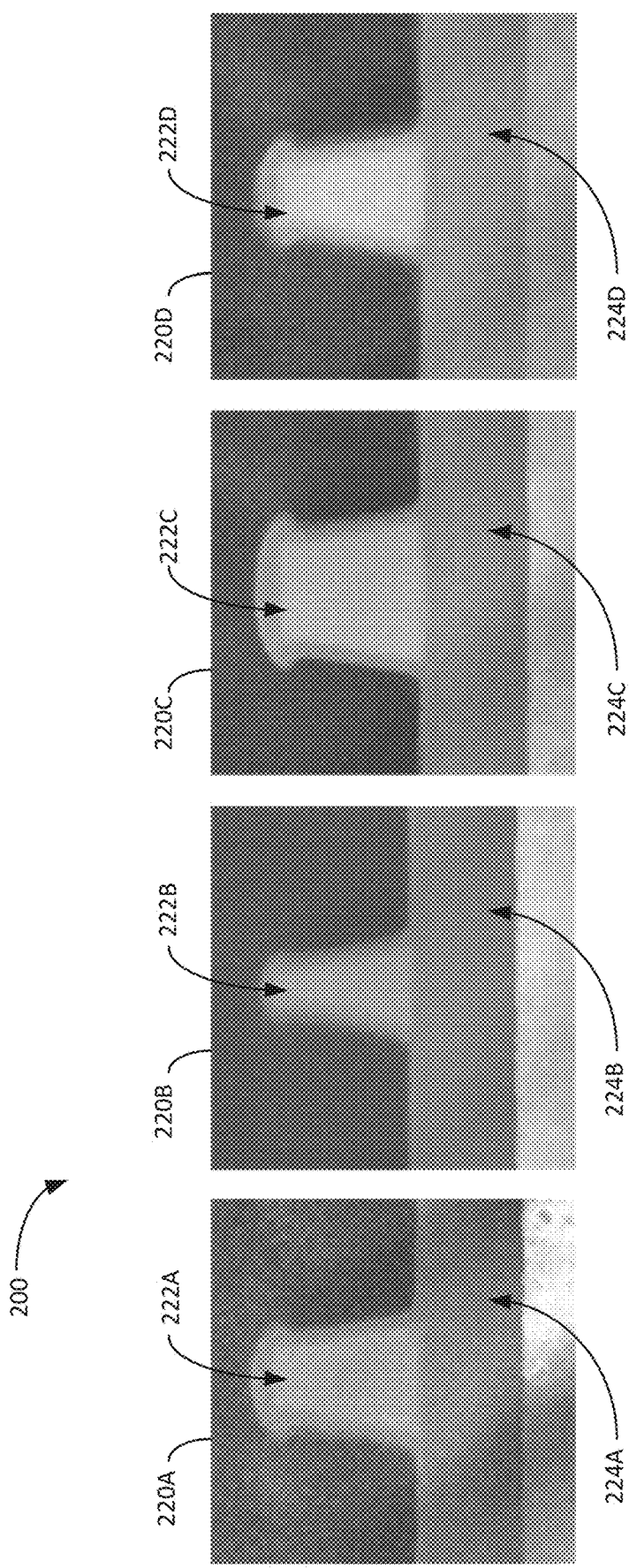
FIG. 2 includes a number of example illustrations of features in TEM images.

FIG. 2 includes a number of example illustrations 200 of features in TEM images. The images in FIG. 2 provide examples of the variations in both feature shape/size and image quality, as discussed above and can affect robust automated metrology. Illustrations 200 include images 220A through 220D, with each image 220 showing respective features 222 and 224. The features 222A-D and 224A-D may be features of interest and desired metrology information, such as width of feature 222 at various locations, the height of feature 222, and thickness of feature 224, is obtained through the techniques disclosed herein.

As can be seen in FIG. 2, each image 220A-D is of a different quality, such as contrast, sharpness, texture, and noise, even after they have been contrast normalized. The images 200, after being contrast normalized, are provided to a parameter estimation network, such as PEN 114, so that the desired metrology data may be automatically and robustly determined. Without the use of the PEN, the wide variation in image quality and feature shape/size may require a user to manually verify measurement locations and data even when using conventional automated measurement techniques.

FIG. 3 is an example flow diagram of a parameter estimation network (PEN) 314 in accordance with an embodiment disclosed herein. The PEN 314, which may be an example of PEN 114, receives an initial image and a plurality of model parameters, e.g., a parameter set, as inputs for performing metrology on one or more features included in the image. The PEN 314 may be performed by a computing system or a charged particle environment system, such as system 100 for example, to provide measurements, e.g., metrology data, on desired features in one or more images. In some embodiments, the images may be TEM images of nanometer-scaled features of integrated circuit components, but that is not limiting on the present disclosure. The input images may not need any pre-processing but may at least be normalized for contrast and sized for the PEN 314.

PEN 314 may begin at process block 330, which generates a model or models of the features of interest based on an initial parameter set $P_0$. The initial parameter set $P_0$ can include any number of desired parameters that define the features of interest. In the embodiment of method 300, $P_0$ includes 17 parameters that define the model shown in model images 332 and 334. Model image 332 shows boundaries of the features of interest, such as the squat pillar 222 and the sub-layer 224. The parameter space may be based on geometric models, statistical models, or any model that provides for parametrization of the feature(s) of interest. The initial parameters $P_0$ may describe the features using a target size/shape based on CAD data, for example, or may be based on a heuristically generated parameters from previous measurements. The model generation block 330 generates the region model 334, which defines the different regions of the features and background. The region model 334 shows the squat pillar 222 in green, sub-layer 224 in red and background in blue, is the background being anything that is not either the squat pillar 222 or the sub-layer 224. Additionally, the model generation block 330 generates the boundary model 332 that shows the boundaries of the features of interest, such as the squat pillar and sub-layer.

Process block 336 receives the two models, region model 334 and boundary model 332, along with the image 320 of the features. The process block 336 may be a regression convolutional neural network (RCNN) that includes a number of convolutional nodes followed by a number of fully connected layers, e.g., regression layers. In general, process block 336 may localize features in the image 320 using segmentation techniques, e.g., FCN techniques, to identify the features of interest in image 320, along with optimizing the parameters $P_0$ of the model, fitting the model images to the feature, which provides error/deviation of the feature in the image to the initial parameters $P_0$. Additionally, process block 336 may re-orient the features in the image 320, if necessary, and crop out the features.

The process block 336 compares the region and boundary model images 334, 332 to the image 320 and determines how the parameters should be adjusted to provide a better fit of the model to the features in image 320. The error/adjustment amount is then provided to combiner 338, which also receives the initial parameters $P_0$. The combiner 338 then provides updated parameter set $P_1$ based on how the error/adjustment amount changes the parameter set $P_0$.

The updated parameter set $P_1$ is then provided to process block 340, which generates region and boundary model images 344 and 342, respectively, based on parameter set $P_1$.

The process block 346 then performs the parameter estimation process similar to process block 336 to further optimize the parameter set. Combiner 348 then compares the further optimized parameters provided by process block 346 with parameter set $P_1$ to provide update parameter set $P_2$.

The process may then repeat until the difference between the output of a RCNN block and the updated parameters is less than a threshold pixel size, for example. Alternatively, the PEN 314 may iterate until a threshold number of iterations have been performed, for example. Once the PEN 314 has ended, the final parameter set may be used to define the features. The defined features are then used to provide the metrology data on those features. As such, the model based on the updated parameter set is the basis of the metrology data.

Figure 4:
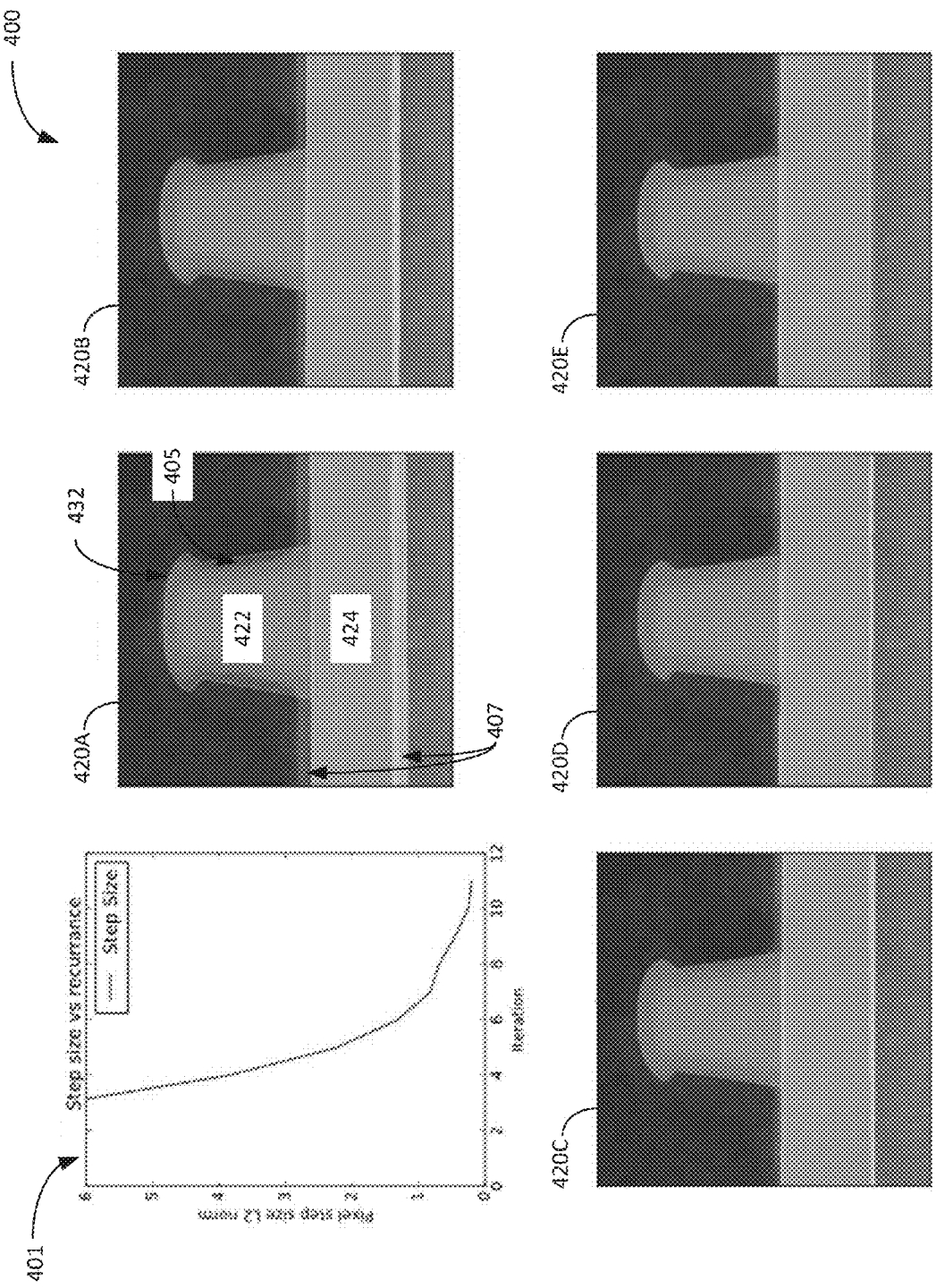
FIG. 4 is an image sequence showing the change in model parameters shown by model-based images in accordance with an embodiment of the present disclosure.

FIG. 4 is an image sequence 400 showing the change in model parameters shown by model-based images in accordance with an embodiment of the present disclosure. The image sequence 400 shows the evolution of model parameters as optimized by the PEN 314, for example. The image sequence 400 shows the change in the regional and boundary model images in relation to a TEM image as their respective parameter sets change due to iterations by the PEN 314. The graph 401 shows the change in pixel step size, e.g., change in error between the image and the models, per iteration of the PEN 314.

Image 420A shows features 422 and 424 (green part of the image), squat pillar and sub-layer, respectively, along with boundary model image 432 (blue line), and region model image 434 (red part of image, which appears orange and yellow due to the green image color). See images 332 and 334 for example boundary and region model images. The boundary and region model images 432 and 434 are based on an initial, generic parameter set P0, as discussed above, and likely do not match the features 422 and 424 of the image 420A. The mismatch is illustrated by the red region 405, which shows a difference in the feature 422 and the squat pillar portion of the region model 434. Additionally, the boundary model 432 does not sit on the feature boundaries as can be seen by the red area and the areas 407 above and below feature 424. Further, and maybe harder to highlight, is the top of feature 422 extending above boundary 432. The RCNN 336 of PEN 314 identifies the mismatch and provides a new parameter set P1 to provide a better match between the models 432, 434 and the features 422, 424 of image 420A.

Image 420B shows the new models 432, 434 and their changes with respect to the features 422, 424. As can be seen in image 420B, the red area between the squat pillar 422 and the boundary 432 has decreased, and the boundary 432 has become more align with the top edges of the squat pillar 422 including the mushroom-like portions. Additionally, the mismatch areas 407 have decreased as well with the region model 434 moving up to be more in line with the sub-layer 424. Again, the RCNN 336 of PEN 314 identifies the mismatch and provides a new parameter set P2 to provide a better match between the models 432, 434 and the features 422, 424 of image 420B.

Images 420C through 420E show further refinement/optimization of the new models 432, 434 and their changes with respect to the features 422, 424. Image, 420E shows, at least to the human, models matched to the features of interest.

As can be seen in graph 401, as iterations of PEN 314 are performed, the pixel step size based on L2 norm becomes sub-pixel changes between the models and the image after 6 iterations. This implies that the differences between the models and the image are less than a pixel size and results in high precision metrology of the features based on the obtain model parameters Pn.

Figure 5:
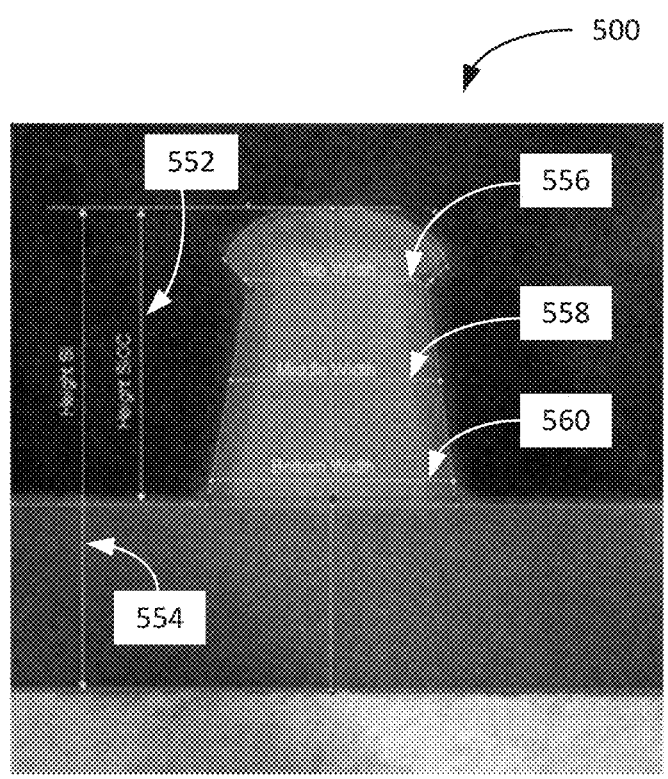
FIG. 5 is an example image showing metrology of features in accordance with an embodiment of the present disclosure.

FIG. 5 is an example image 500 showing metrology of features in accordance with an embodiment of the present disclosure. The image 500 includes metrology data of squat pillar and sub-layer features 522 and 524, respectively. The data is based on an optimized parameter set as provided by PEN 314, for example. The metrology data, which is also determined by PEN 314, includes a height 552 of the squat pillar, a height 554 of the squat pillar plus the sub-layer, and a widths of the squat layer at various height locations. For example, a top width 556, a middle width 558 and a bottom width 560 may be determined. While four measurements are shown in image 500, the number and location of measurements may be any desired.

According to one embodiment, the techniques described herein are implemented by one or more special-purpose computing devices. The special-purpose computing devices may be hard-wired to perform the techniques, or may include digital electronic devices such as one or more application-specific integrated circuits (ASICs), field programmable gate arrays (FPGAs), or network processing units (NPUs) that are persistently programmed to perform the techniques, or may include one or more general purpose hardware processors or graphics processing units (GPUs) programmed to perform the techniques pursuant to program instructions in firmware, memory, other storage, or a combination. Such special-purpose computing devices may also combine custom hard-wired logic, ASICs, FPGAs, or NPUs with custom programming to accomplish the techniques. The special-purpose computing devices may be desktop computer systems, portable computer systems, handheld devices, networking devices or any other device that incorporates hard-wired and/or program logic to implement the techniques.

For example, FIG. 6 is a block diagram that illustrates a computer system 600 upon which an embodiment of the invention may be implemented. The computing system 600 may be an example of the computing hardware included with CPM environment 102, such a controller 112, imaging platform 108, sample preparation platform 110, and/or servers 106. Additionally, computer system 600 may be used to implement the one or more neural networks disclosed herein, such as PEN 114 and/or RCNN 336/346. Computer system 600 at least includes a bus 640 or other communication mechanism for communicating information, and a hardware processor 642 coupled with bus 640 for processing information. Hardware processor 642 may be, for example, a general purpose microprocessor. The computing system 600 may be used to implement the methods and techniques disclosed herein, such as methods 301 and 401, and may also be used to obtain images and segment said images with one or more classes.

Computer system 600 also includes a main memory 644, such as a random access memory (RAM) or other dynamic storage device, coupled to bus 640 for storing information and instructions to be executed by processor 642. Main memory 644 also may be used for storing temporary variables or other intermediate information during execution of instructions to be executed by processor 642. Such instructions, when stored in non-transitory storage media accessible to processor 642, render computer system 600 into a special-purpose machine that is customized to perform the operations specified in the instructions.

Computer system 600 further includes a read only memory (ROM) 646 or other static storage device coupled to bus 640 for storing static information and instructions for processor 642. A storage device 648, such as a magnetic disk or optical disk, is provided and coupled to bus 640 for storing information and instructions.

Computer system 600 may be coupled via bus 640 to a display 650, such as a cathode ray tube (CRT), for displaying information to a computer user. An input device 652, including alphanumeric and other keys, is coupled to bus 640 for communicating information and command selections to processor 642. Another type of user input device is cursor control 654, such as a mouse, a trackball, or cursor direction keys for communicating direction information and command selections to processor 642 and for controlling cursor movement on display 650. This input device typically has two degrees of freedom in two axes, a first axis (e.g., x) and a second axis (e.g., y), that allows the device to specify positions in a plane.

Computer system 600 may implement the techniques described herein using customized hard-wired logic, one or more ASICs or FPGAs, firmware and/or program logic which in combination with the computer system causes or programs computer system 600 to be a special-purpose machine. According to one embodiment, the techniques herein are performed by computer system 600 in response to processor 642 executing one or more sequences of one or more instructions contained in main memory 644. Such instructions may be read into main memory 644 from another storage medium, such as storage device 648. Execution of the sequences of instructions contained in main memory 644 causes processor 642 to perform the process steps described herein. In alternative embodiments, hard-wired circuitry may be used in place of or in combination with software instructions.

The term "storage media" as used herein refers to any non-transitory media that store data and/or instructions that cause a machine to operate in a specific fashion. Such storage media may comprise non-volatile media and/or volatile media. Non-volatile media includes, for example, optical or magnetic disks, such as storage device 648. Volatile media includes dynamic memory, such as main memory 644. Common forms of storage media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge, content-addressable memory (CAM), and ternary content-addressable memory (TCAM).

Storage media is distinct from but may be used in conjunction with transmission media. Transmission media participates in transferring information between storage media. For example, transmission media includes coaxial cables, copper wire and fiber optics, including the wires that comprise bus 640. Transmission media can also take the form of acoustic or light waves, such as those generated during radio-wave and infra-red data communications.

Various forms of media may be involved in carrying one or more sequences of one or more instructions to processor 642 for execution. For example, the instructions may initially be carried on a magnetic disk or solid state drive of a remote computer. The remote computer can load the instructions into its dynamic memory and send the instructions over a telephone line using a modem. A modem local to computer system 600 can receive the data on the telephone line and use an infra-red transmitter to convert the data to an infra-red signal. An infra-red detector can receive the data carried in the infra-red signal and appropriate circuitry can place the data on bus 640. Bus 640 carries the data to main memory 644, from which processor 642 retrieves and executes the instructions. The instructions received by main memory 644 may optionally be stored on storage device 648 either before or after execution by processor 642.

Computer system 600 also includes a communication interface 656 coupled to bus 640. Communication interface 656 provides a two-way data communication coupling to a network link 658 that is connected to a local network 660. For example, communication interface 656 may be an integrated services digital network (ISDN) card, cable modem, satellite modem, or a modem to provide a data communication connection to a corresponding type of telephone line. As another example, communication interface 656 may be a local area network (LAN) card to provide a data communication connection to a compatible LAN. Wireless links may also be implemented. In any such implementation, communication interface 656 sends and receives electrical, electromagnetic or optical signals that carry digital data streams representing various types of information.

Network link 658 typically provides data communication through one or more networks to other data devices. For example, network link 658 may provide a connection through local network 660 to a host computer 662 or to data equipment operated by an Internet Service Provider (ISP) 664. ISP 664 in turn provides data communication services through the world wide packet data communication network now commonly referred to as the "Internet" 666. Local network 660 and Internet 666 both use electrical, electromagnetic or optical signals that carry digital data streams. The signals through the various networks and the signals on network link 658 and through communication interface 656, which carry the digital data to and from computer system 600, are example forms of transmission media.

Computer system 600 can send messages and receive data, including program code, through the network(s), network link 658 and communication interface 656. In the Internet example, a server 668 might transmit a requested code for an application program through Internet 666, ISP 664, local network 660 and communication interface 656.

The received code may be executed by processor 642 as it is received, and/or stored in storage device 648, or other non-volatile storage for later execution.

In some examples, values, procedures, or apparatuses are referred to as "lowest", "best", "minimum," or the like. It will be appreciated that such descriptions are intended to indicate that a selection among many used functional alternatives can be made, and such selections need not be better, smaller, or otherwise preferable to other selections. In addition, the values selected may be obtained by numerical or other approximate means and may only be an approximation to the theoretically correct/value.

What is claimed is:

1. A method comprising:
    generating a regional model image of a feature based on first model parameters;
    generating a boundary model image of the feature based on the first model parameters;
    optimizing, using a parameter estimation network, the model parameters based on comparing the regional and boundary model images to a feature of interest in an image, wherein optimizing, using a parameter estimation network, the model parameters based comparing the regional and boundary model images to a feature of interest in an image includes:
        segmenting, using the parameter estimation network, the image to extract the feature of interest;
        comparing, using the parameter estimation network, the extracted feature of interest to region and boundary models generated based on a first parameter set;
        based on the comparison, determining, by the parameter estimation network, changes to the first parameter set so that the region and boundary model images match the feature of interest; and
        updating the first parameter set based on the determined changes; and
    providing one or more feature dimensions based on the optimized model parameters.

2. The method of claim 1, wherein optimizing, using a parameter estimation network, the model parameters based comparing the regional and boundary model images to a feature of interest in an image includes:
    iteratively updating, using the parameter estimation network, the model parameters based on comparing updated region and boundary model images to the feature of interest in the image, wherein the updated region and boundary model images are based on a parameter set updated in a previous iteration.

3. The method of claim 1, wherein the parameter estimation network includes a regression convolutional neural network.

4. The method of claim 1, wherein the steps of comparing, determining and updating are performed until either a threshold number of iterations are met or a threshold step size between iterations is met.

5. The method of claim 1, wherein generating a boundary image of the feature based on the first model parameters includes:
    generating a pixel mask image, the pixel mask image defining a type and location of the feature.

6. The method of claim 1, wherein providing one or more feature dimensions based on the optimized model parameters includes:
    determining a truncated distance weighting for each pixel from a feature boundary; and
    generating the boundary image based on the truncated distance weighting.

7. The method of claim 1, wherein the first parameters are initial parameters.

8. The method of claim 1, wherein the first parameters are updated parameters.

9. A method comprising:
    optimizing, using a parameter estimation network, a parameter set to fit a feature in an image based on one or more models of the feature, the parameter set defining the one or more models, wherein optimizing, using a parameter estimation network, a parameter set to fit a feature in an image includes:
        using a regression convolutional neural network, segmenting the image to extract the feature in the image; and
        using the regression convolutional neural network, fitting the parameter set to the feature in the image to optimize the parameter set; and providing metrology data of the feature in the image based on the optimized parameter set.

10. The method of claim 9, wherein optimizing, using a parameter estimation network, a parameter set to fit a feature in an image includes:
   comparing, by a regression convolutional neural network, the one or more feature models formed based on the parameter set to the feature in the image; and
   based on differences between the one or more feature models and the feature in the image, updating the parameter set to provide an optimized parameter set.

11. The method of claim 10, wherein updating the parameter set to provide an optimized parameter set includes iteratively adjusting the parameter set so that the one or more models converge to match the feature in the image.

12. The method of claim 9, wherein optimizing, using a parameter estimation network, a parameter set to fit a feature in an image based on one or more models of the feature includes:
   recursively updating the parameter set based on a difference between the one or more models generated on an updated parameter set and the feature in the image until convergence is obtained.

13. The method of claim 12, wherein convergence is determined either when a threshold number of iterations has been met, or when a step size of parameter set change is below a threshold number of pixels.

14. The method of claim 9, further including aligning the extracted feature to the one or more models.

15. The method of claim 9, further including generating a region model of the feature based on the parameter set, wherein the region model is a pixel mask image defining a type and location of the feature.

16. The method of claim 9, further including generating a boundary model of the feature based on the parameter set, wherein each pixel in the boundary model is a truncated distance weighting from a feature boundary.

17. The method of claim 9, wherein providing metrology data of the feature in the image based on the optimized parameter set includes:
   generating a model of the feature based on the optimized parameter set, wherein the generated model determines the metrology data.

18. The method of claim 9, wherein the one or more models includes a region model image and a boundary model image.

* * * * *